United States Patent
Daigle et al.

(10) Patent No.: US 7,686,621 B2
(45) Date of Patent: Mar. 30, 2010

(54) INTEGRATED CIRCUIT TEST SOCKET HAVING ELASTIC CONTACT SUPPORT AND METHODS FOR USE THEREWITH

(75) Inventors: Steven Daigle, Austin, TX (US); Michael Beatty, Pflugerville, TX (US)

(73) Assignee: Sigmatel, Inc., Austin, TX (US)

( * ) Notice: Subject to any disclaimer, the term of this patent is extended or adjusted under 35 U.S.C. 154(b) by 41 days.

(21) Appl. No.: 12/046,804

(22) Filed: Mar. 12, 2008

(65) Prior Publication Data

US 2009/0233463 A1   Sep. 17, 2009

(51) Int. Cl.
*H01R 1/00* (2006.01)
(52) U.S. Cl. .................. 439/72; 324/755; 324/765
(58) Field of Classification Search .............. 439/72, 439/70; 324/755, 765
See application file for complete search history.

(56) References Cited

U.S. PATENT DOCUMENTS

| | | | | |
|---|---|---|---|---|
| 6,474,997 | B1 * | 11/2002 | Ochiai | 439/70 |
| 6,896,525 | B2 * | 5/2005 | Kuo | 439/72 |
| 7,445,465 | B2 * | 11/2008 | Lopez et al. | 439/72 |
| 2002/0129861 | A1 * | 9/2002 | Holdenried | 138/109 |

* cited by examiner

*Primary Examiner*—Gary F. Paumen

(57) ABSTRACT

A socket can be used for testing an integrated circuit package having a plurality of rows of leads. The socket includes a base that is aligned with a circuit board having a plurality of contact pads. A plurality of rows of contact fingers are electrically coupled to the plurality of contact pads, each of the plurality of rows of contact fingers for engaging a corresponding one of the plurality of rows of leads in response to a retention force applied to the integrated circuit package. Each of the contact finger has a cantilevered end that is supported by a supporting force generated by an elastic contact in response to the retention force.

20 Claims, 4 Drawing Sheets

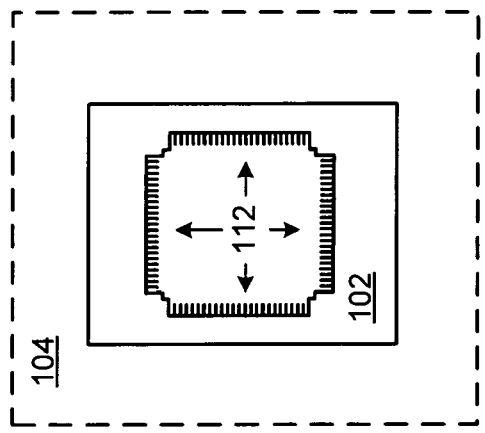
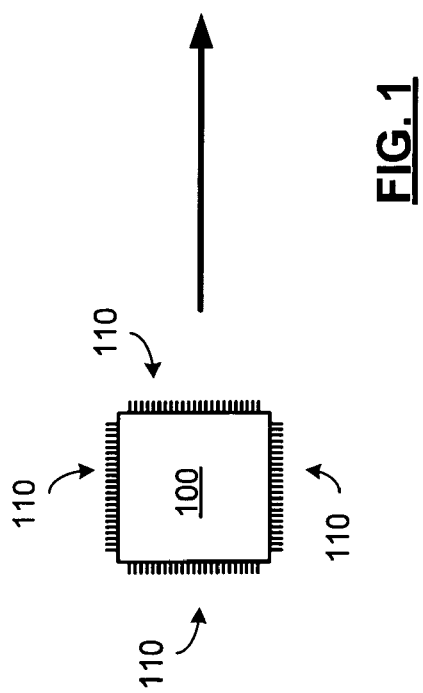
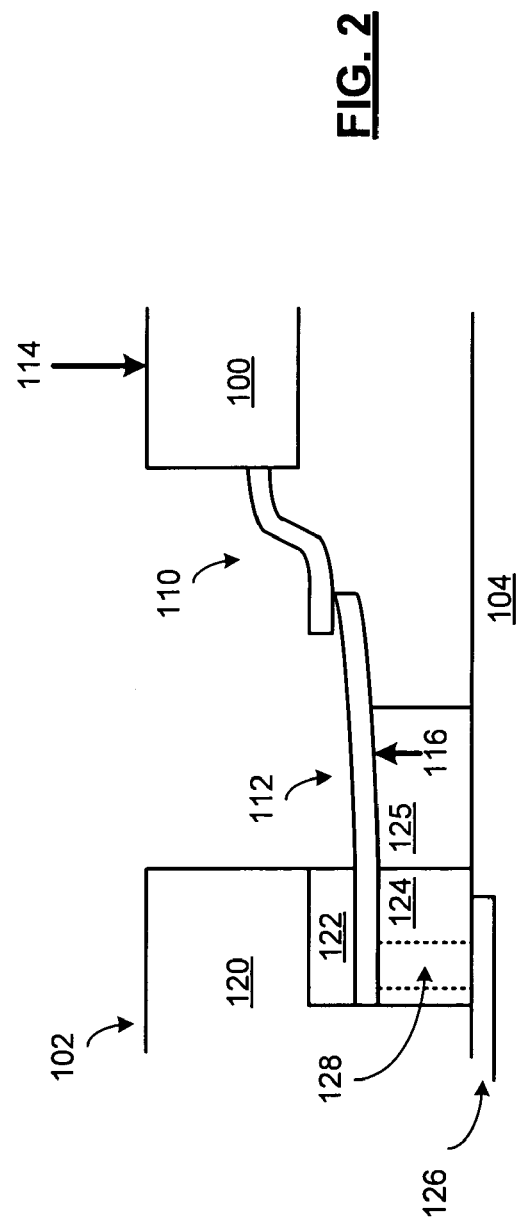

INTEGRATED CIRCUIT TEST SOCKET HAVING ELASTIC CONTACT SUPPORT AND METHODS FOR USE THEREWITH

CROSS REFERENCE TO RELATED PATENTS

None

TECHNICAL FIELD OF THE INVENTION

The present invention relates to integrated circuit connectors, particularly used in test set sockets.

DESCRIPTION OF RELATED ART

Integrated circuit packages have a plurality of metal leads for connecting to a circuit board. For example, a quad flat package can include a number of leads arranged in rows along each of the four sides of the chip for mounting to a circuit board using surface mount technology. Examples of quad flat packages are the bumpered quad flat package, low profile quad flat package, small and very small quad flat packages, thin and very thin quad flat packages, etc.

When an integrated circuit is manufactured it can be tested using an automated test set. This automated test set can include a pick and place device for picking up a device under test and inserting it in a test socket that is coupled to a circuit board that runs the device through a series of tests to verify that the device under test performs properly. The test socket may be subjected to tens or hundreds of thousands of cycles if large numbers of parts are tested. The sockets includes a plurality of contacts to mate with the leads of the integrated circuit package. If one or another of these contacts becomes worn or deformed and no longer is consistent in making adequate contact with the device under test, a device under test may fail a test and be categorized as "bad" due to the contact, even if the device under test is otherwise a "good" part.

This and other disadvantages of traditional and convention approaches will be evident to one skilled in the art when presented the disclosure herein.

BRIEF DESCRIPTION OF THE SEVERAL VIEWS OF THE DRAWINGS

FIG. 1 presents a pictorial diagram representation of the top view of an integrated circuit package 100 and a test socket 102 in accordance with an embodiment of the present invention.

FIG. 2 presents a cross section of a side view of a portion of integrated circuit package 100 and a test socket 102 in accordance with an embodiment of the present invention.

Figure 3:
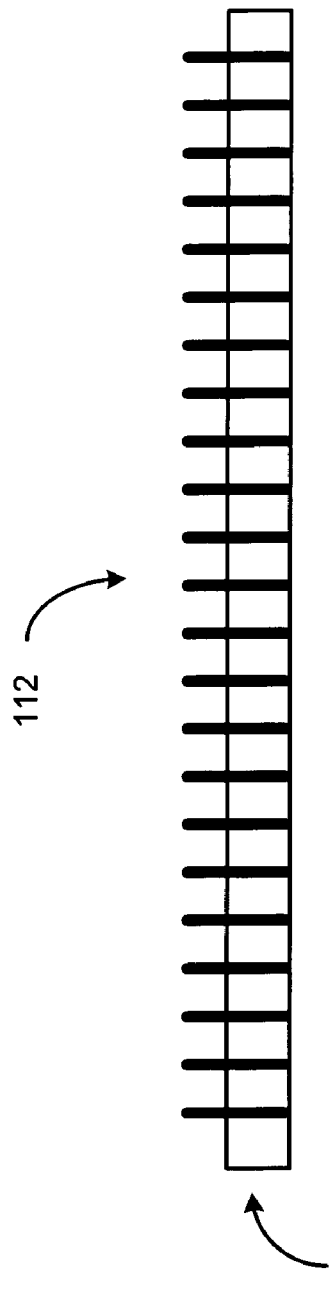
FIG. 3 presents a pictorial diagram representation of an elastic contact support 225 in accordance with an embodiment of the present invention.

DETAILED DESCRIPTION OF THE INVENTION INCLUDING THE PRESENTLY PREFERRED EMBODIMENTS

The embodiments of the present invention yield several advantages over the prior art. In particular, an elastic contact support supports the cantilevered ends to a test socket's contacts to maintain the proper alignment of the contacts over repeated test cycles.

FIG. 1 presents a pictorial diagram representation of the top view of an integrated circuit package 100 and a test socket 102 in accordance with an embodiment of the present invention. An example test socket 102 is shown, coupled to circuit board 104, that accepts an integrated circuit package 100 that is shown as a 100 pin quad flat package. When integrated circuit package 100 is inserted in test socket 102, the four rows of leads 110 engage with the corresponding four rows of contact fingers 112 to connect the integrated circuit 100 to the test socket 102 and ultimately to the circuit board 104.

In an embodiment of the present invention a pick and place device includes a chuck, plug, gripper or other device that picks up the integrated circuit device and place or hold the device in test socket 102 for testing. While the integrated circuit package is connected to test socket 102, the operation of integrated circuit package 100 can be tested via circuit board 104. When testing is complete, the integrated circuit package 100 can be removed by the pick and place device and a new testing cycle can begin with another integrated circuit package being inserted in test socket 102 for testing.

Further details including several optional functions and features of test socket 102 are presented in conjunction with FIGS. 2-6.

FIG. 2 presents a cross section of a side view of a portion of integrated circuit package 100 and a test socket 102 in accordance with an embodiment of the present invention. In particular, contact finger 112 includes a portion that is supported by base 120 of socket 102 via an insulating strip 122 and an elastomeric strip 124. Elastomeric strip 124 includes a plurality of conductive channels, such as channel 124, that are impregnated with a metal, such as nickel, to provide a low resistance path between contact finger 112 and a metal contact 126 of circuit board 104. The remaining portion of contact finger 112 forms a cantilevered end that makes mechanical and electrical contact at its tip with the lead 110 of integrated circuit package 100.

In an embodiment of the present invention, contact finger 112 is constructed of a conductive metal, such as beryllium copper, that can deform elastically. The cantilevered end of contact finger 112 is supported by elastic support member 125. In operation, each of the contact fingers 112 engages a corresponding one of the plurality of rows of leads in response to a retention force 114 applied to the integrated circuit package 100. As discussed in conjunction with FIG. 1, a chuck, plug, gripper or other device picks up the integrated circuit device 100. A pick and place device, via the chuck, plug, gripper or other device, applies the retaining force 114 to hold the integrated circuit package 100 in test socket 102 for testing. Elastic contact support 125 is coupled to provide a supporting force 116 on the cantilevered end of each of the contact fingers 112 in response to the retention force 114 to make and maintain the electrical contact between each of the contact fingers 112 and each of the leads 110.

In an embodiment of the present invention, the elastic contact support 125 includes an elastic member such as a silicon rubber elastic member; a rubber elastic member; a plastic elastic member, a synthetic rubber elastic member and/or other elastic member that compresses in response to the retaining force 114 exerted through leads 110 to contact fingers 112. The movement of the contact finger 112 across the lead 110, while the elastic contact support compresses, provides a scrubbing of the contact finger 112 against the lead 110, providing a better electrical contact with lower contact resistance. The supporting force 116 applied by elastic contact support 125 helps prevent the plastic deformation of one or more contact fingers 112 and further compensates for contact finger wear, increasing the number of testing cycles of test socket 102 prior to failure. In this fashion, test socket can be rated for 200,000 test cycles or more. In an embodiment of the present invention, the elastic contact support 125 is constructed of an insulating material that is resistant to electrostatic discharge to avoid damage to the integrated circuit 100 and an undesirable current path from contact finger 112.

While elastic contact support 125 is shown as being supported by circuit board 104, base 120 of test socket 102 could provide a floor that supports elastic contact support member 125 while including one or more passages or contacts for electrically coupling elastomeric strip 124 to metal contact 126 of circuit board 104.

While a particular configuration of elastic support member 125 is shown, the elastic support member can be configured in other ways to provide the supporting force 116 along a portion or all of the cantilevered end of contact finger 112.

FIG. 3 presents a pictorial diagram representation of an elastic contact support 225 in accordance with an embodiment of the present invention. In particular, elastic contact support 225, such as elastic contact support 125, is configured as a support strip that supports and entire row of contact fingers 112. As understood by one skilled in the art when presented the disclosure herein, each of the rows of contact fingers could be supported in this fashion with a corresponding elastic contact support 225.

Figure 4:
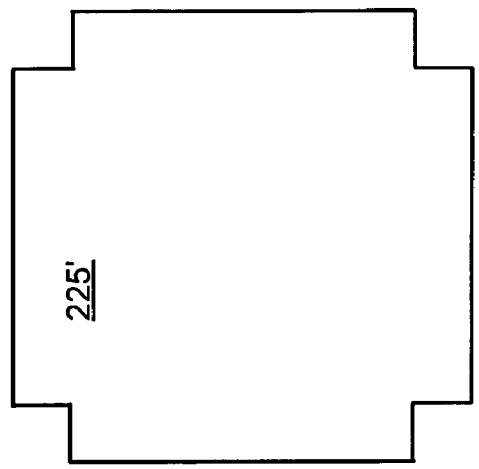
FIG. 4 presents a pictorial diagram representation of an elastic contact support 225' in accordance with an embodiment of the present invention.

FIG. 4 presents a pictorial diagram representation of an elastic contact support 225' in accordance with an embodiment of the present invention. In particular, elastic contact support 225', such as elastic contact support 125, is configured as a contiguous elastic sheet that supports and four rows of contact fingers 112 along each of the four edges. In an embodiment of the present invention, the elastic sheet is ⅓" thick, though greater or lesser thicknesses can be used based on particular the configuration of the test socket 102.

While FIGS. 1-4 have presented the use of elastic contact support 125 for use in conjunction with a test socket 102 that accepts a particular integrated circuit package. It should be noted that elastic contact support 125 can be used in test sockets of other integrated circuit packages with a greater or lesser number of leads, or in support of contacts to other posts, pads or other input/output conductors of other integrated circuit packages.

Figure 5:
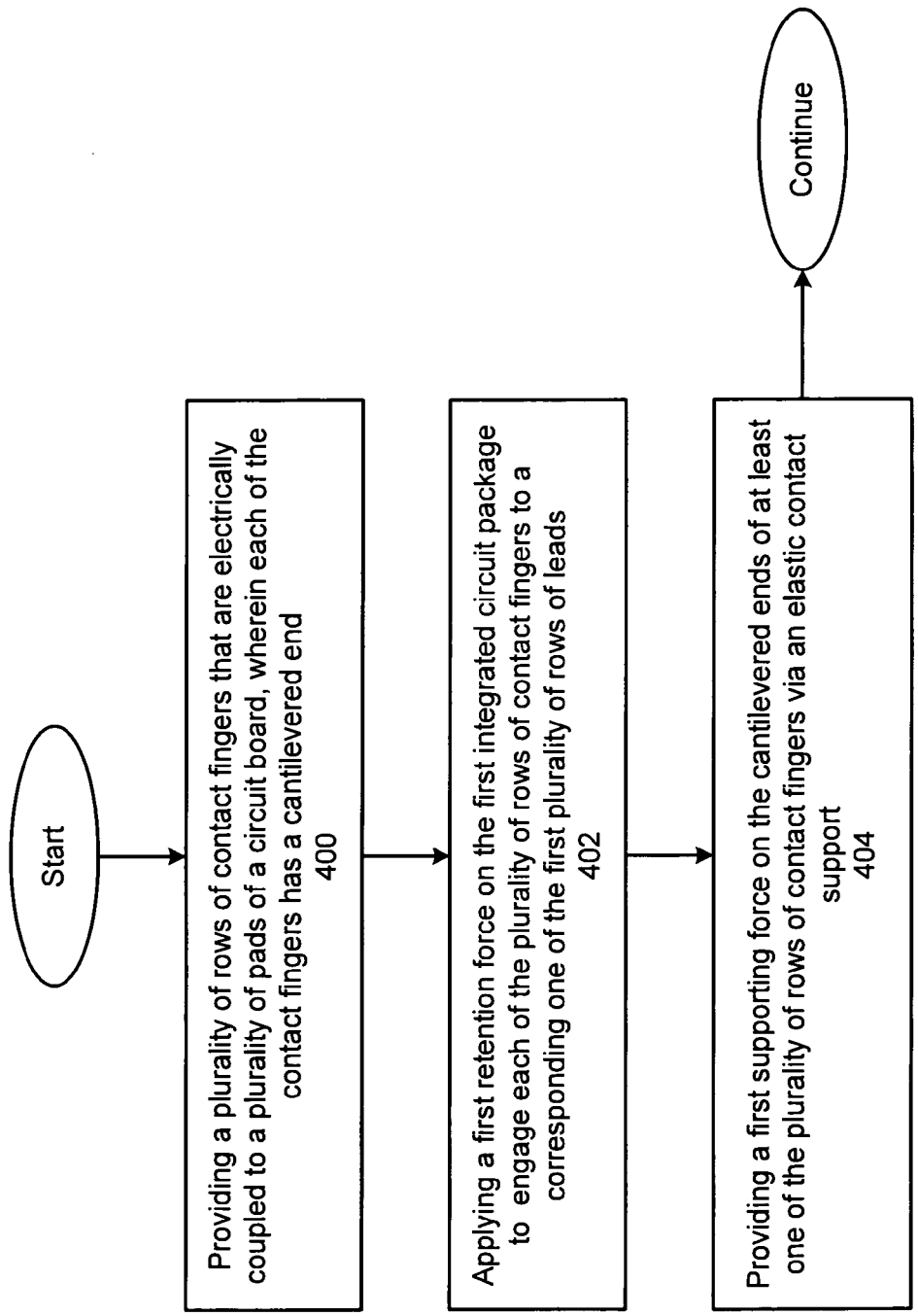
FIG. 5 presents a flowchart representation of a method in accordance with an embodiment of the present invention.

FIG. 5 presents a flowchart representation of a method in accordance with an embodiment of the present invention. In particular a method is presented for use in conjunction with one or more of the functions and features described in conjunction with FIGS. 1-4. In step 400, a plurality of rows of contact fingers are provided that are electrically coupled to a plurality of contact pads of a circuit board, wherein each of the contact fingers has a cantilevered end. In step 402, a first retention force is applied on the first integrated circuit package to engage each of the plurality of rows of contact fingers to a corresponding one of the first plurality of rows of leads. In step 404, a first supporting force is applied on the cantilevered end of each of the contact fingers in response to the first retention force via an elastic contact support.

In an embodiment of the present invention, the elastic contact support includes at least one elastic strip that supports the cantilevered ends of at least one of the plurality of rows of contact fingers. In another embodiment, the elastic contact support includes a contiguous elastic sheet that supports the cantilevered ends of the plurality of rows of contact fingers. The elastic contact support can include a silicon rubber elastic member; a rubber elastic member; a plastic elastic member and/or a synthetic rubber elastic member. The elastic contact support can include an electrostatic discharge resistant material and/or an insulating material. The first integrated circuit package can be a square surface mount package having four rows of leads.

Figure 6:
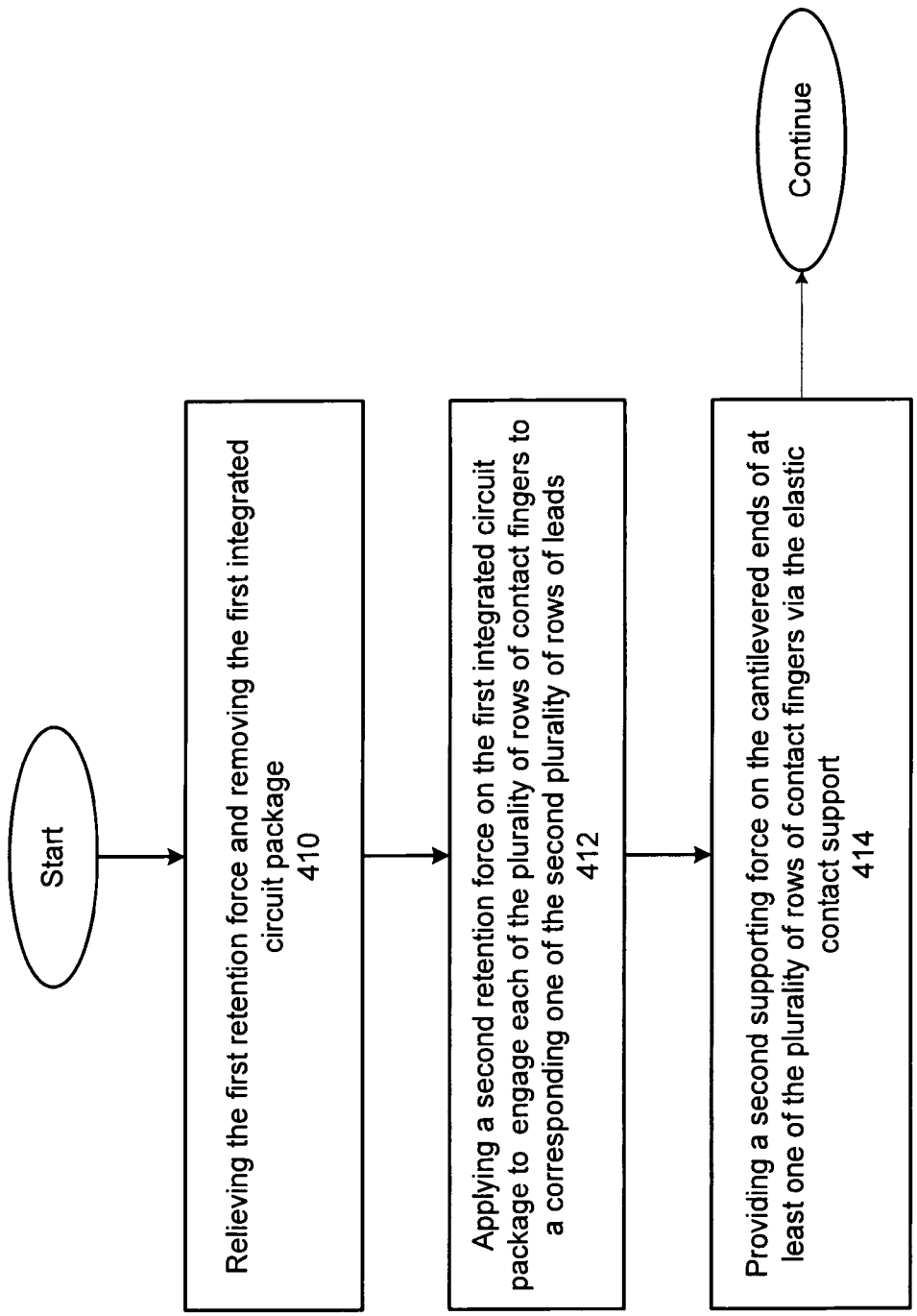
FIG. 6 presents a flowchart representation of a method in accordance with an embodiment of the present invention.

FIG. 6 presents a flowchart representation of a method in accordance with an embodiment of the present invention. In particular a method is presented for use in conjunction with the method of FIG. 5. In step 410, the first retention force is relieved and the first integrated circuit package is removed. In step 412, a second retention force is applied on a second integrated circuit package, having a second plurality of rows of leads, to engage each of the plurality of rows of contact fingers to a corresponding one of the second plurality of rows of leads. In step 414, a second supporting force is applied on the cantilevered end of each of the contact fingers in response to the second retention force via the elastic contact support.

As one of ordinary skill in the art will further appreciate, the term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "coupled".

Thus, there has been described herein an apparatus and method, as well as several embodiments including a preferred embodiment, for implementing a test socket. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. A device for interfacing with an integrated circuit package having a plurality of rows of leads, the device comprising:
    a base that is aligned with a circuit board having a plurality of contact pads;
    a plurality of rows of contact fingers, electrically coupled to the plurality of contact pads, each of the plurality of rows of contact fingers for engaging a corresponding one of the plurality of rows of leads in response to a retention force applied to the integrated circuit package, each of the contact fingers having a first end that is cantilevered, a second end, and being substantially straight between the first end and the second end; and
    an elastic contact support that is coupled to provide a first supporting force on the first end of each of the contact fingers in response to the retention force.

2. The device of claim 1 wherein the elastic contact support includes at least one elastic strip that supports the first ends of at least one of the plurality of rows of contact fingers.

3. The device of claim 1 wherein the elastic contact support includes a contiguous elastic sheet that supports the first ends of the plurality of rows of contact fingers.

4. The device of claim 1 wherein the elastic contact support includes at least one of: a silicon rubber elastic member; a rubber elastic member; a plastic elastic member and a synthetic rubber elastic member.

5. The device of claim 1 wherein the elastic contact support includes an electrostatic discharge resistant material.

6. The device of claim 1 wherein the elastic contact support includes an insulating material.

7. The device of claim 1 wherein the integrated circuit package is a square surface mount package having four rows of leads.

8. The device of claim 1 further comprising:
a plurality of elastomeric strips that electrically couple the plurality of rows of contact fingers to the plurality of contact pads.

9. The device of claim 8 wherein the plurality of elastomeric strips each include a plurality of metal impregnated channels that electrically couple the plurality of rows of contact fingers to the plurality of contact pads.

10. The device of claim 1 wherein the socket is configured for cyclic testing of a plurality of integrated circuit packages including the integrated circuit package.

11. A method of coupling a first integrated circuit package, having a first plurality of rows of leads, to a circuit board having a plurality of contact pads, the method comprising:
providing a plurality of rows of contact fingers that are electrically coupled to a plurality of contact pads of a circuit board, wherein each of the contact fingers has a first end that is cantilevered, a second end, and being substantially straight between the first end and the second end;
applying a first retention force on the first integrated circuit package to engage each of the plurality of rows of contact fingers to a corresponding one of the first plurality of rows of leads; and
providing a first supporting force on the first end of each of the contact fingers in response to the first retention force via an elastic contact support.

12. The method of claim 11 wherein the elastic contact support includes at least one elastic strip that supports the first ends of at least one of the plurality of rows of contact fingers.

13. The method of claim 11 wherein the elastic contact support includes a contiguous elastic sheet that supports the first ends of the plurality of rows of contact fingers.

14. The method of claim 11 wherein the elastic contact support includes at least one of: a silicon rubber elastic member; a rubber elastic member; a plastic elastic member and a synthetic rubber elastic member.

15. The method of claim 11 wherein the elastic contact support includes an electrostatic discharge resistant material.

16. The method of claim 11 wherein the elastic contact support includes an insulating material.

17. The method of claim 11 wherein the first integrated circuit package is a square surface mount package having four rows of leads.

18. The method of claim 11 further comprising:
relieving the first retention force and removing the first integrated circuit package;
applying a second retention force on a second integrated circuit package, having a second plurality of rows of leads, to engage each of the plurality of rows of contact fingers to a corresponding one of the second plurality of rows of leads; and
providing a second supporting force on the first end of each of the contact fingers in response to the second retention force via the elastic contact support.

19. A device for interfacing with an integrated circuit package having a plurality of rows of leads, the device comprising:
a base that is aligned with a circuit board having a plurality of contact pads;
a row of contact fingers, the row of contact fingers for engaging a row of leads in response to a retention force applied to the integrated circuit package, each of the contact fingers having a cantilevered end;
an elastomeric strip that electrically couples the row of contact fingers to the plurality of contact pads; and
an elastic contact support that is coupled to provide a first supporting force on the cantilevered end of each of the contact fingers in response to the retention force.

20. The device of claim 19 wherein the elastomeric strip includes a plurality of metal impregnated channels that electrically couple the contact fingers to the plurality of contact pads.

\* \* \* \* \*